(12) United States Patent
Yogo et al.

(10) Patent No.: US 7,215,021 B2
(45) Date of Patent: May 8, 2007

(54) ELECTRONIC DEVICE

(75) Inventors: Takayuki Yogo, Hitachinaka (JP); Hiroyuki Abe, Naka (JP); Shinya Igarashi, Naka (JP)

(73) Assignees: Hitachi, Ltd., Tokyo (JP); Hitachi Car Engineering Co., Ltd., Hitachinaka-shi (JP)

( * ) Notice: Subject to any disclaimer, the term of this patent is extended or adjusted under 35 U.S.C. 154(b) by 0 days.

(21) Appl. No.: 10/630,773

(22) Filed: Jul. 31, 2003

(65) Prior Publication Data

US 2004/0113267 A1 Jun. 17, 2004

(30) Foreign Application Priority Data

Aug. 1, 2002 (JP) .............................. 2002-224329

(51) Int. Cl.
  *H01L 23/34*  (2006.01)
  *H01L 23/13*  (2006.01)
  *G01F 1/684*  (2006.01)
  *F02D 35/00*  (2006.01)
  *H05K 3/34*  (2006.01)

(52) U.S. Cl. .................. 257/723; 257/E51.04; 257/48; 257/620; 257/528; 257/532; 257/696; 257/685; 257/777; 73/204.22; 73/204.25; 73/204.11

(58) Field of Classification Search .......... 257/E51.04, 257/48, 620, 686, 685, 723, 777, 528, 732; 73/204.22, 204.25, 204.11

See application file for complete search history.

(56) References Cited

U.S. PATENT DOCUMENTS 5,468,681 A * 11/1995 Pasch .......................... 438/108
5,615,658 A * 4/1997 Hashimoto ................... 123/539
5,821,624 A * 10/1998 Pasch ........................... 257/776
5,977,783 A * 11/1999 Takayama et al. ........... 324/754
5,982,272 A * 11/1999 Masuda ....................... 338/162
5,997,711 A * 12/1999 Bourke .......................... 205/94
6,142,018 A * 11/2000 Dedert et al. .................. 73/305
6,220,501 B1 * 4/2001 Tadauchi et al. ............. 228/208
6,332,442 B1 * 12/2001 Komada et al. ........ 123/184.55
6,472,594 B1 * 10/2002 Ichinose et al. ............. 136/256

(Continued)

FOREIGN PATENT DOCUMENTS

DE    197 07 253 A1    9/1997

(Continued)

OTHER PUBLICATIONS

German Office Action dated Mar. 20, 2006, including an English translation of pertinent portion (Seven (7) pages).

*Primary Examiner*—Alexander Oscar Williams
(74) *Attorney, Agent, or Firm*—Crowell & Moring LLP (57) ABSTRACT

The conductor wire surface for constituting a circuit formed by print or junction on a substrate formed from a composite member of ceramics, resin, and an inorganic member and from a resin member is coated with glass, resin, solder, or silver paste, thus the corrosion resistance can be improved, and a highly reliable electronic device for car use can be provided. Further, the probing portion necessary for adjustment of the resistance and characteristics and the mounting portion for mounting parts are formed in a shape having no corners at 90° or less, for example, in a circular shape, in an elliptical shape, or in a shape that the corners of a tetragon are rounded (R) or chamfered (C).

7 Claims, 8 Drawing Sheets

U.S. PATENT DOCUMENTS

| | | | |
|---|---|---|---|
| 6,623,620 B2 * | 9/2003 | Lai et al. | 205/786.5 |
| 6,652,731 B2 * | 11/2003 | Cobley et al. | 205/296 |
| 6,829,135 B2 * | 12/2004 | Honda et al. | 361/306.1 |
| 6,879,033 B2 * | 4/2005 | Hosoya | 257/699 |
| 6,922,068 B2 * | 7/2005 | Lee et al. | 324/754 |
| 2002/0132501 A1 * | 9/2002 | Eldridge et al. | 439/66 |
| 2002/0145032 A1 * | 10/2002 | Khandros et al. | 228/155 |
| 2004/0011650 A1 * | 1/2004 | Zenhausern et al. | 204/547 |
| 2004/0043479 A1 * | 3/2004 | Briscoe et al. | 435/288.5 |
| 2004/0257633 A1 * | 12/2004 | Agrawal et al. | 359/265 |
| 2005/0155866 A1 * | 7/2005 | Gabe et al. | 205/296 |
| 2005/0269727 A1 * | 12/2005 | Aisenbrey | 264/104 |

FOREIGN PATENT DOCUMENTS

| | | |
|---|---|---|
| JP | 63-253659 | 10/1988 |
| JP | 03-019387 | 1/1991 |
| JP | 03-019387 A | 1/1991 |
| JP | 04-334083 | 5/1991 |
| JP | 05-263735 | 10/1993 |
| JP | 05-263735 A | 10/1993 |
| JP | 05-275823 | 10/1993 |
| JP | 05-275823 A | 10/1993 |
| JP | 2002-148077 | 5/2002 |
| JP | 2002-148077 A | 5/2002 |

* cited by examiner

R: LONG SIDE x 1/10 OR MORE

ELECTRONIC DEVICE

BACKGROUND OF THE INVENTION

The present invention relates to an electronic device, and particularly to a sealing structure for various sensors for outputting various physical quantities as electrical signals by a sensing element for detecting various physical quantities. The invention also relates to an electronic circuit for controlling the sensing element installed in an engine compartment and to a mounting structure with improved corrosion resistance, for mounting an electronic circuit of an electronic device in a vehicle, said electronic device having a microprocessor for controlling various states of the vehicle upon receipt of electrical signals of the aforementioned various sensors.

Various kinds of known hybrid IC substrates have a thick film resistor printed on a ceramic substrate and include parts such as a semiconductor integrated circuit, a capacitor, and a diode. For a hybrid IC substrate having conductor wires of silver, silver alloy, copper, or copper alloy, (particularly for a hybrid IC substrate adopted in an electronic device for car use), corrosion of the conductor wires due to corrosive gas is a concern, and as a corrosion improvement measure, coating the conductor wires with glass is considered.

However, the resistors printed on a hybrid IC substrate and the mounted electronic parts are varied, and to provide a highly precise electronic device, the resistance and characteristics must be adjusted. For that purpose, an exposed conductor part is required. As a method for covering the exposed part, soldering is generally used.

However, it is a method in consideration of contact at the time of probing instead of a target of improving the corrosion resistance, which is limited to a case necessary for probing. Further, even when soldering is adopted, there are many exposed parts of the conductor wires due to poor wettability of solder.

As an improvement measure for solder wettability, as described in Japanese Laid-Open Patent Publication No. Hei 04-334083, an improving method by a process such as two-dimensional calcination is adopted.

SUMMARY OF THE INVENTION

According to the prior art, the conductor wires constituting the circuit are not partially overcoated and the corrosion resistance is not satisfactory in some environment. Further, even in a constitution of overcoating with solder, due to poor wettability of solder, the conductor wires and the ends of the mounting portion of a mounted part, particularly the corners are exposed and the corrosion resistance is not satisfied.

An object of the present invention is to keep the function of the electronic circuit away from damage even if the opening is corroded and improve the corrosion resistance.

The above object can be accomplished by the invention stated in the claims. For example, to solve the aforementioned problem of corrosion resistance in an electronic device, for probing of resistance adjustment and characteristic adjustment, by use of a structure of overcoating the glass or resin coating opening with solder or metallic paste, the corrosion resistance can be improved. Further, the opening is formed in a shape having no corners at 90° or less, for example, in a circular shape, in an elliptical shape, or in a shape that the corners of a tetragon are rounded (R) or chamfered (C), thus the corrosion resistance can be improved.

Further, the opening is branched from the conductor line constituting the circuit or the conductors are formed in parallel, thus even if the opening is corroded, the function of the electronic circuit can be prevented from damage and the corrosion resistance can be improved.

Other objects, advantages and novel features of the present invention will become apparent from the following detailed description of the invention when considered in conjunction with the accompanying drawings.

DESCRIPTION OF THE PREFERRED EMBODIMENTS

Figure 1:
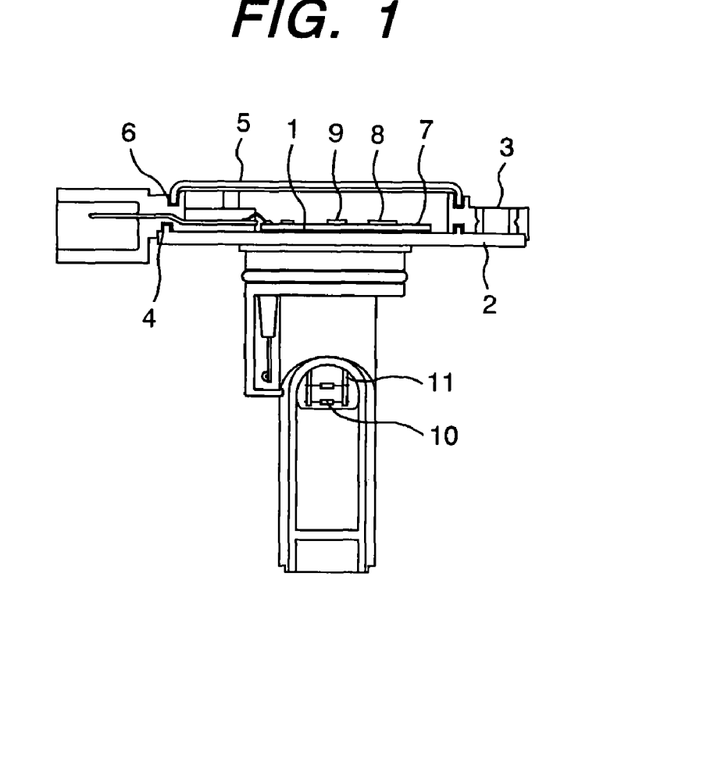
FIG. 1 is a cross sectional schematic view of an electronic device for car use showing the characteristics of the present invention.
Figure 2:
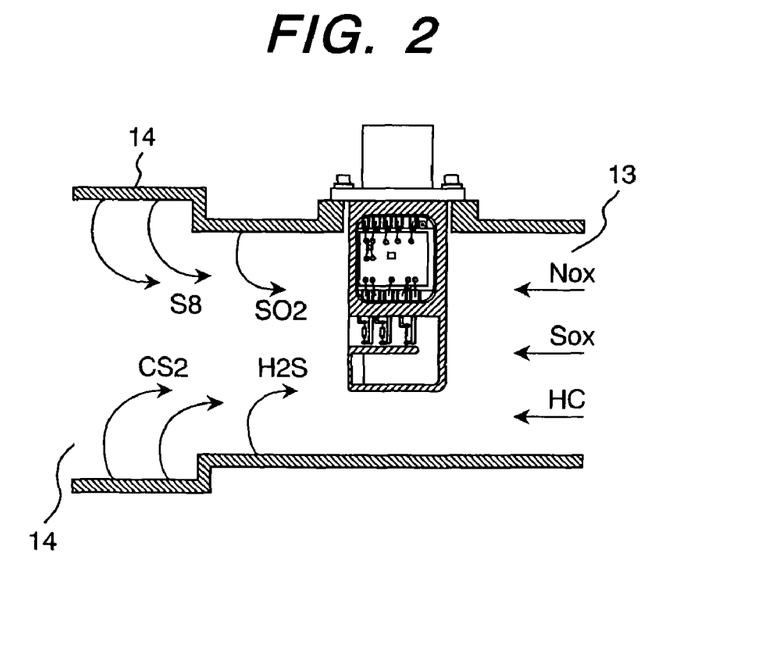
FIG. 2 is a drawing showing an example of an environment where an electronic device for car use is put.

Firstly, a typical cross sectional structure of an electronic device for car use exposed to a severe corrosion environment as an electronic device is shown in FIG. 1. Further, by referring to FIG. 2 showing the corrosion environment to which the electronic device for car use is exposed, the structure of the electronic device for car use, use environment, and problems will be explained. The electronic device for car use is broadly divided into a fuel control unit for a sensor and a control unit and an ignition control unit for an igniter and a coil.

The sensor detects physical quantities such as the intake air flow rate, air temperature, atmospheric pressure, and boost pressure, and the control unit has a function for receiving a signal of the sensor and controlling the combustion state in the cylinders, and the igniter and coil have a function for controlling the ignition time in the cylinders.

The common structural feature of these electronic devices for car use is that they each have an electronic driving circuit 1 or an electronic control circuit and are fixed to a metallic base 2 on which the electronic driving circuit 1 or the electronic control circuit is installed. A case 3 for storing the electronic driving circuit 1 or the electronic control circuit is fixed (4) to the base 2, and moreover the top thereof is frequently fixed (6) by a cover 5.

For the electronic driving circuit 1 or the electronic control circuit, a hybrid IC substrate 9 which is formed by printing and calcining a conductor wire 8 as a conductor of the circuit and a resistor on the surface of a plane substrate 7 formed by an inorganic material such as ceramics and provided with a capacitor, a diode, and a semiconductor integrated circuit on the surface is often adopted and to promote heat dissipation from the hybrid IC substrate 9, the hybrid IC substrate 9 is adhered and fixed to the metallic base 2 by a silicone adhesive.

Since the metallic base 2 serves as a heat sink for heat dissipation, a metal having a high heat transfer rate, particularly aluminum is often used. The case 3 covering the hybrid IC substrate 9 and the cover 5 for covering the top are formed integrally with the connector which is an interface for I/O signals of the electronic driving circuit 1 and a structure that a terminal 11 composed of a conductive member for controlling transfer of an electrical signal is inserted into the resin forming the case 3 is often used.

In this case, the sensor for detecting the physical quantities such as the intake air temperature, intake air flow rate, and boost pressure is structured so as to install a sensing element 10 outside or in the case opening and electrically connected to the electronic driving circuit 1 via the terminal 11. The case 3 is adhered and fixed (4) to the base 2 and the cover 5 is also adhered and fixed (6) to the case 3.

As resin materials for forming the case 3 and the cover 5, resins having superior injection moldability such as polyethylene terephthalate (PET), polyphenylene sulfide (PPS), nylon 6, nylon 66, nylon 11, and nylon 12 are adopted in many electronic devices for car use.

In this case, the resin case 3 and metallic base 2 aforementioned are greatly different in the coefficient of linear expansion, so that an elastic adhesive having viscous elasticity like the silicone adhesive 12 is often used to adhere and seal them. Further, in most cases, an epoxy adhesive is used when the case 3 and the cover 5 are composed of the same member, while a silicone adhesive is used when they are composed of different members.

For most electronic devices for car use explained above, an adhesive is often adopted for junction of components and the silicone adhesive 12 is often used.

However, the silicone adhesive 12 has some faults due to the intrinsic properties of silicone resin. Inside the engine room of a car with an electronic device for car use loaded, combustion gas is blown back from the engine, and unburned gas is returned, thus the inside of the engine room is exposed to an atmosphere 13 of staying hydrocarbon.

Further, the inside of the engine room is crowded with products such as a rubber duct and a hose containing sulfur which are often arranged in the engine components, thus the temperature of the electronic device inside the engine exceeds 100° C. In this state, from the products vulcanized by sulfur such as the rubber duct and hose, single sulfur gas or sulfur combined gas 14 is ejected.

Further, these sulfur gases vary with the environment and may result in, as mentioned above, blow-back of combustion gas, return of unburned gas, or coexistence with the hydrocarbon 13, thus unless an electronic device for car use resistant to these corrosive gases is manufactured, there is the possibility that a highly reliable product may not be obtained.

The reason is that in these electronic devices for car use, the conductor wires 8 formed on the plane substrate 7 of the electronic driving circuit 1 are often formed by silver or silver alloy, and when corrosive gas, particularly sulfur gas or the sulfur combined gas 14 enters the case 3, the silver, silver alloy, copper, and copper alloy wire parts of the conductor wires 8 are corroded, and there is the possibility that the conductor wires 8 of the electronic driving circuit 1 may be broken and the electronic driving circuit 1 may not be operated normally.

Sulfide corrosion of the conductor wires 8 is generated in the exposed part of the conductor wires 8, so that we propose an electronic device for car use that the exposed part is covered with glass, resin, solder, or metallic paste, thus the function for protecting the electronic driving circuit 1 from corrosive gas is improved.

The sulfide corrosion countermeasure structure for an electronic device of the present invention will be explained hereunder.

Figure 3:
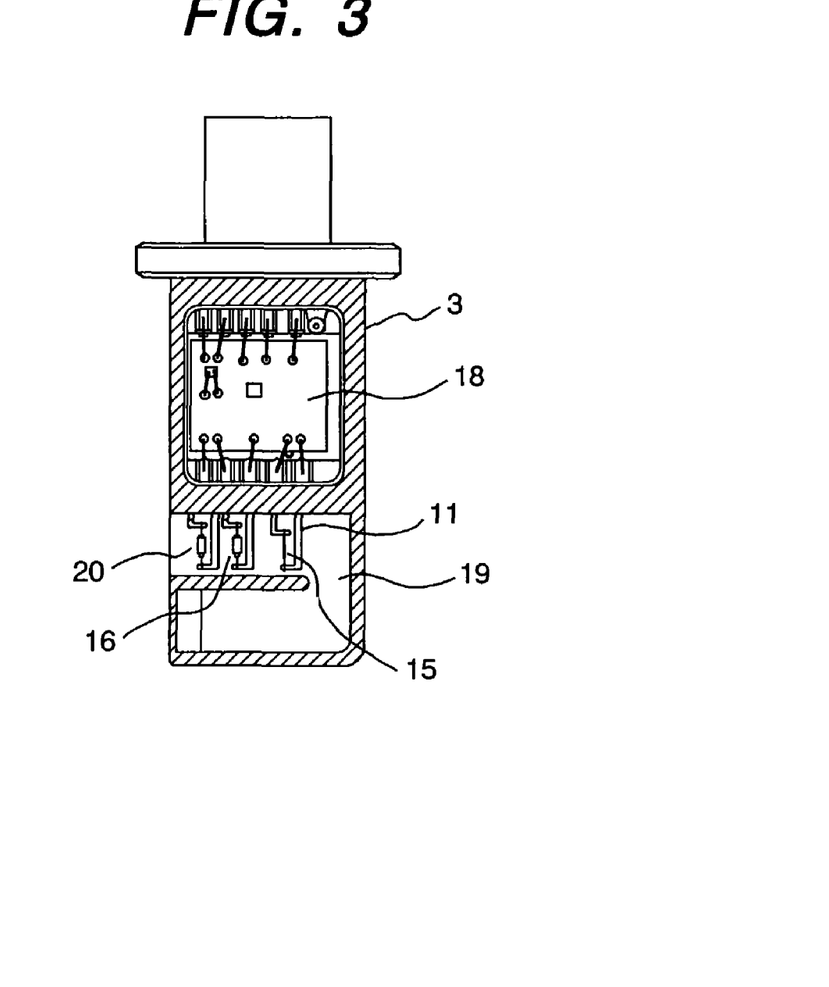
FIG. 3 is a structural diagram of a thermal type air flow measuring instrument.

There are many kinds of electronic devices available and explanation for the all is difficult, so that as representation of an electronic device, the structure of the thermal type air flow measuring instrument for measuring the intake air flow rate shown in FIG. 3 and the embodiment thereof of the present invention will be explained hereunder.

Figure 4:
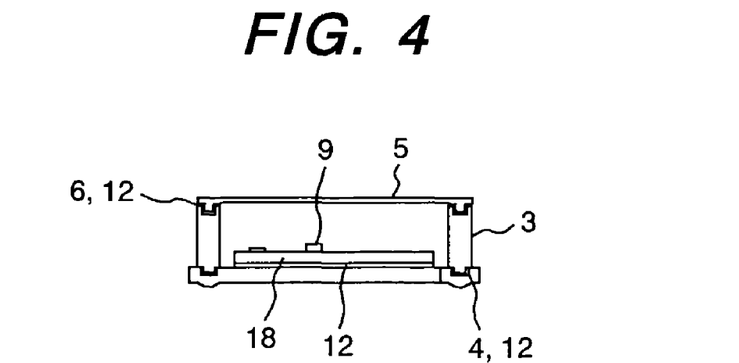
FIG. 4 is a cross sectional schematic view of a thermal type air flow measuring instrument.

Firstly, the thermal type air flow measuring instrument will be explained briefly. FIGS. 3 and 4 are cross sectional structure diagrams showing the structure of the thermal type air flow measuring instrument. The thermal type air flow measuring instrument is a sensor for measuring intake air. A heating resistor 15 of a thermal type air flow measuring instrument 17 using the heating resistor 15 and a temperature sensing resistor 16 is controlled by a constant temperature control circuit 18 so as to always keep a fixed temperature difference from the temperature sensing resistor 16 for measuring the air temperature and heated always.

The heating resistor 15 and the temperature sensing resistor 16 are arranged in an air cleaner for leading air to be sucked into the engine or an air duct installed on the downstream side of the air cleaner and structured so as to transfer an electrical signal via the constant temperature control circuit 18 and the conductive member 11 embedded in the case 3. In the thermal type air flow measuring instrument aforementioned, the base 2 for diffusing self-generated heat of a power device such as a power transistor is a structural substrate. To the base 2, the hybrid IC substrate 9 that the conductor wires 8 and resistors are printed on the front or back of the plane substrate 7 and additionally the semiconductor integrated circuit, power transistor, capacitor, inductor, and diode (shown schematically by blocks 29 in FIG. 5) are mounted is adhered with a silicone adhesive.

Further, the case 3 as a substrate for storing the hybrid IC substrate 9 that the connector, which is an interface unit for transferring a sensor signal to the outside or supplying circuit driving power from the outside, is formed simultaneously is adhered and sealed on the base 2 with the silicone adhesive 12, and then the top of the case 3 is covered with the cover 5 and sealed with a silicone adhesive or an epoxy adhesive.

Figure 5:
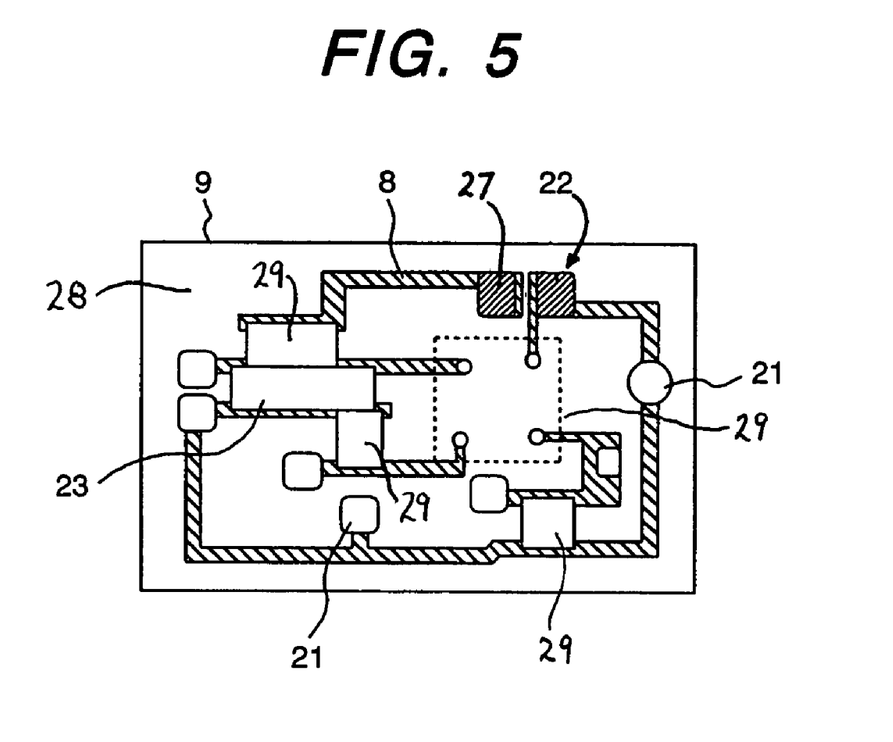
FIG. 5 is a schematic view of an electronic circuit substrate.
Figure 15:
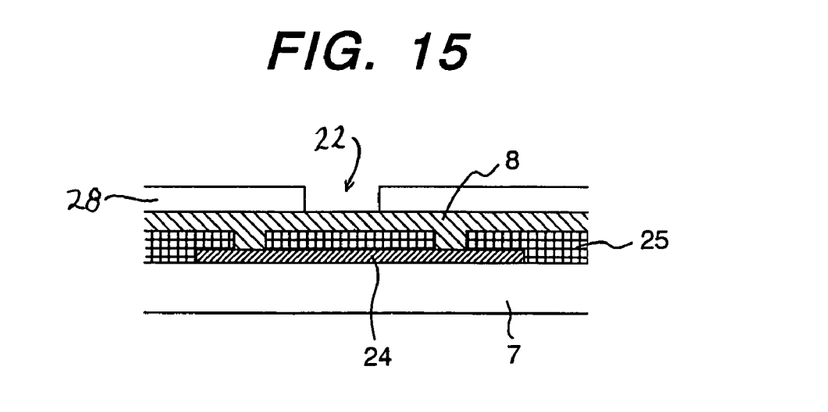
FIG. 15 is a cross sectional structure diagram of an electronic circuit substrate.
Figure 16:
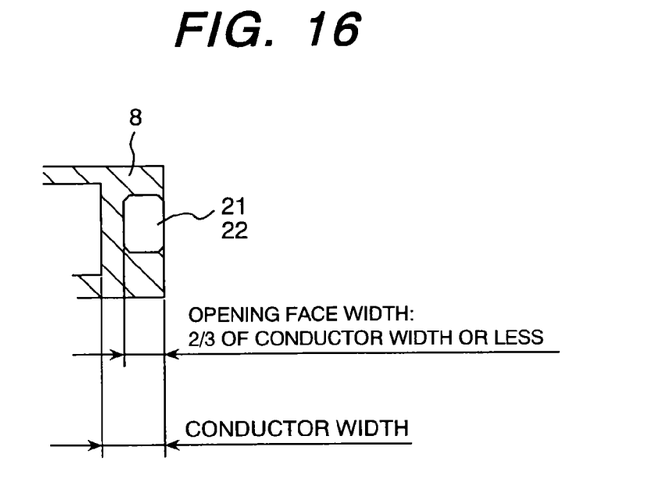
FIG. 16 is a drawing showing an example of a probing portion of an electronic circuit substrate.

In the hybrid IC substrate 9, the printed resistors and conductor wires 8 are coated with glass or resin 28 (FIGS.

5, 15). However, for adjustment of the resistances of the printed resistors and also for adjustment of the characteristics such as output, a probing portion 21 capable of probing, which is electrically connected to the conductor wires 8 must be installed and the probe makes contact with the probing portion so as to adjust the characteristics (FIG. 5).

As described above, when the silicone adhesive 12 adopted to mutually adhere many members has high gas transmissivity and is in a corrosion environment, corrosive gas is transmitted into the case 3 through the adhered and fixed portion 4. Further, corrosive gas enters from the air hole installed in the connector of the case 3.

Therefore, to prevent the situation causing corrosion to the conductor wires 8 of the hybrid IC substrate 9 and mounted parts in the case 3, the probing portion necessary for adjustment which is installed in the hybrid IC substrate 9 or the exposed part of the conductor wires is devised, and the conductor wires 8 are prevented from corrosion due to corrosive gas, thus an electronic device including a thermal type air flow measuring instrument which is highly reliable in corrosion resistance can be manufactured.

Concretely, the probing portion 21 of the hybrid IC substrate 9 is coated with solder or metallic paste, so that the contact of corrosive gas with the conductor wires 8 is reduced and the corrosion resistance can be improved. Further, by coating the exposed part of the conductor wires 8 with glass or resin after adjustment of the resistance and characteristics, the same effects can be obtained.

When the probing portion is to be installed on the hybrid IC substrate 9, it is effective to form an opening 22 in the overcoating glass or resin 28 as shown in FIG. 5, and to coat the opening with a conductive metal such as solder or metallic paste 27. However, in this case, when the wettability of solder or metallic paste to the conductor wires is poor, the conductor wires at the ends, particularly in the corners are exposed and may be corroded by corrosive gas.

Figure 6:
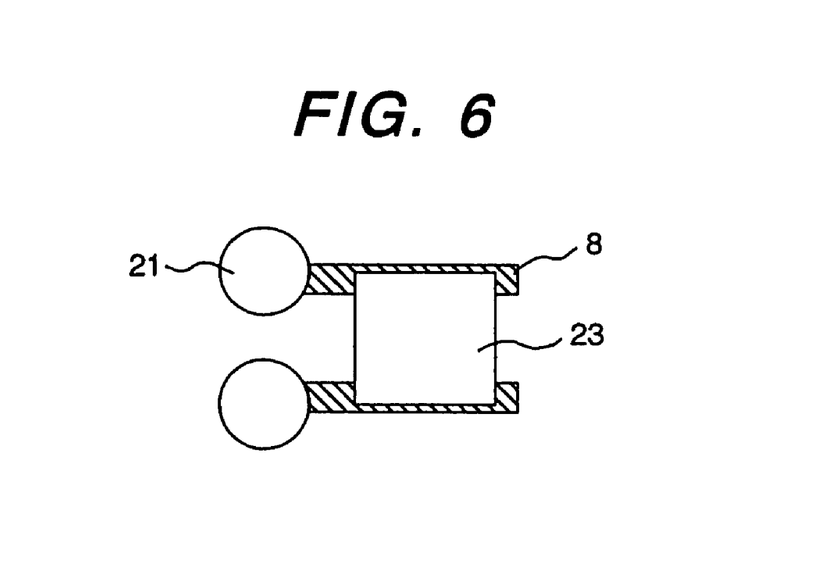
FIG. 6 is a drawing showing an example of a probing portion of an electronic circuit substrate.
Figure 7:
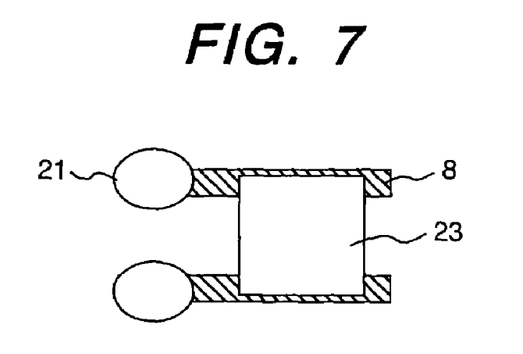
FIG. 7 is a drawing showing an example of a probing portion of an electronic circuit substrate.
Figure 8:
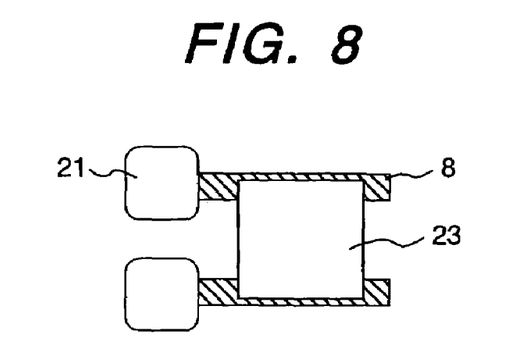
FIG. 8 is a drawing showing an example of a probing portion of an electronic circuit substrate.
Figure 9:
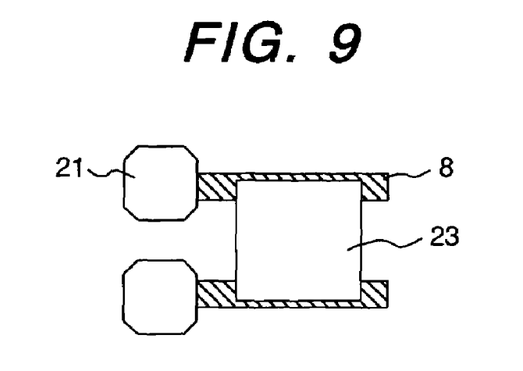
FIG. 9 is a drawing showing an example of a probing portion of an electronic circuit substrate.
Figure 10:
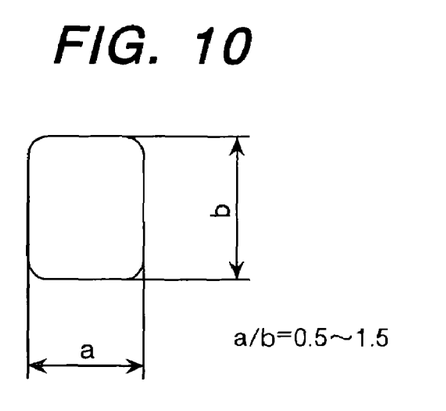
FIG. 10 is a drawing showing an example of a probing portion of an electronic circuit substrate.
Figure 11:
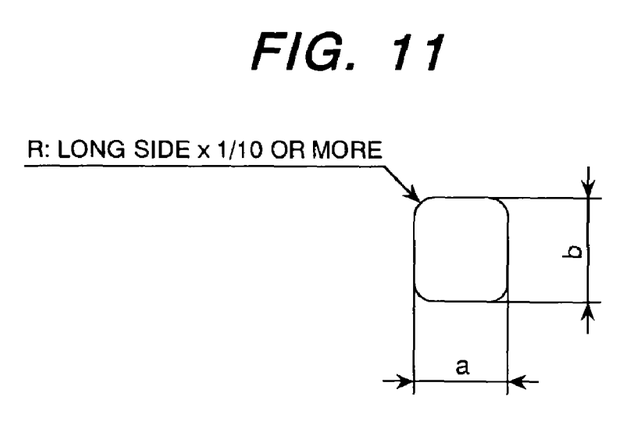
FIG. 11 is a drawing showing an example of a probing portion of an electronic circuit substrate.
Figure 12:
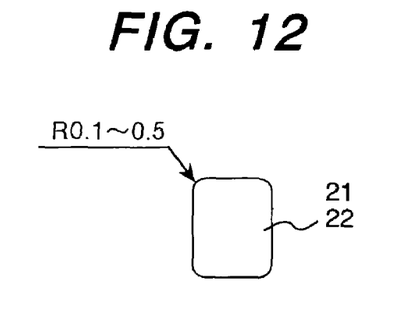
FIG. 12 is a drawing showing an example of a probing portion of an electronic circuit substrate.
Figure 13:
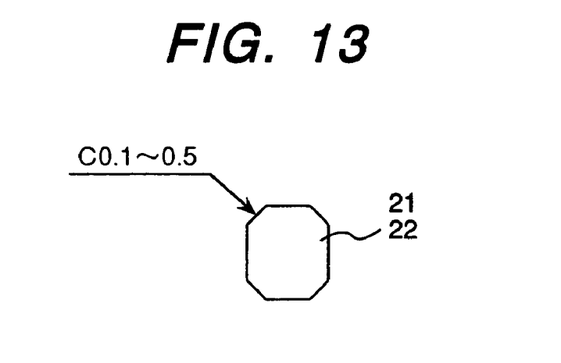
FIG. 13 is a drawing showing an example of a probing portion of an electronic circuit substrate.
Figure 14:
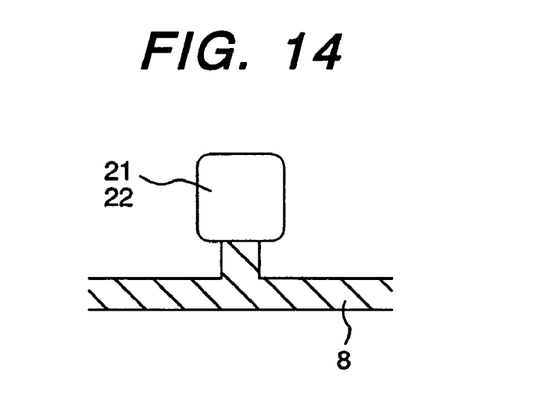
FIG. 14 is a drawing showing an example of a probing portion of an electronic circuit substrate.

Therefore, the surface of the coating portion by solder or metallic paste is formed in a shape having no corners at 90° or less, for example, in a circular shape (FIG. 6), in an elliptical shape (FIG. 7), or in a shape that the corners of a tetragon are rounded (R, circular arc) (FIG. 8) or chamfered (C, tapered) (FIG. 9), thus exposure of the corners at the ends of the conductor wires can be reduced and the corrosion resistance can be improved. In a case of a tetragon, it is desirable to set the ratio of the short side to the long side between 0.5 and 1.5 (FIG. 10) and R and C of the corners respectively between R0.1 and R0.5 and between C0.1 and C0.5 (FIGS. 12 and 13).

Further, when the wettability of solder or metallic paste to the mounting portion for mounting the components such as the capacitor, inductor, and diode on the hybrid IC substrate 9 (FIG. 5) is poor, the conductor wires at the ends, particularly in the corners are exposed and may be corroded by corrosive gas, so that when the corners of the exposed part 22 of the conductor wires 8 for mounting the parts are rounded (R) or chamfered, the corrosion resistance can be improved. At this time, the magnitude of R of the corners is preferably between R0.1 and R0.5 and the magnitude of chamfering is preferably between C0.1 and C0.5.

Further, the conductor wires are formed under the components such as the capacitor, inductor, and diode to be mounted, thus the corrosion resistance can be improved.

Further, by the conductor pattern that the probing portion or the mounting portion is formed in a position branched from the conductor line (e.g., FIG. 5) where the function of the electronic circuit is not damaged even if the portion is disconnected or the conductors are formed in parallel, the corrosion resistance can be improved.

When the conductor wires are formed in a multilayer such as two or more layers, the top and bottom of the probing portion are connected by conductor wires 24 formed under an insulator 25 such as glass (FIG. 15). Thus, even if the exposed part of the conductor 22 is corroded, the conductor wires are connected by the lower layer 24, and the circuit constitution is kept, so that the corrosion resistance can be improved.

Figure 17:
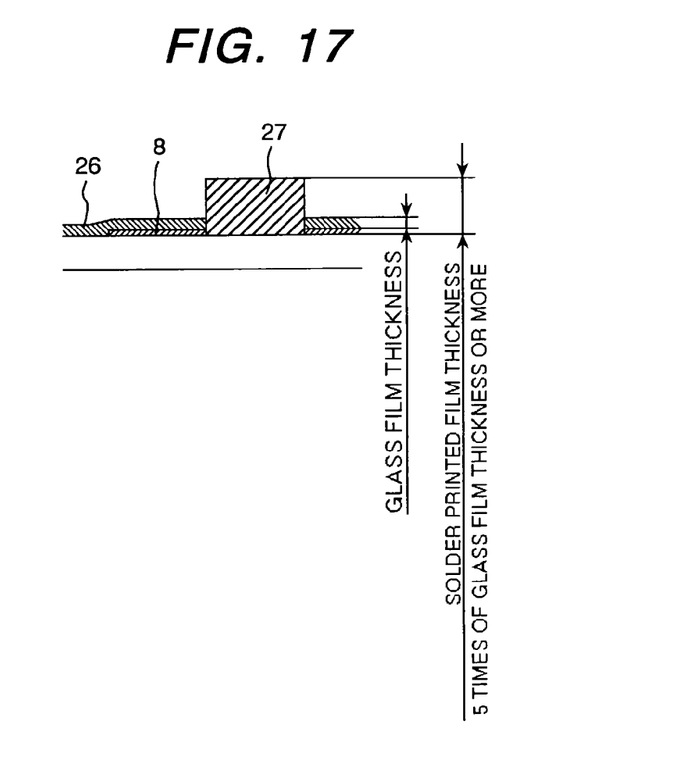
FIG. 17 is a cross sectional structure diagram of an electronic circuit substrate.
Figure 18:
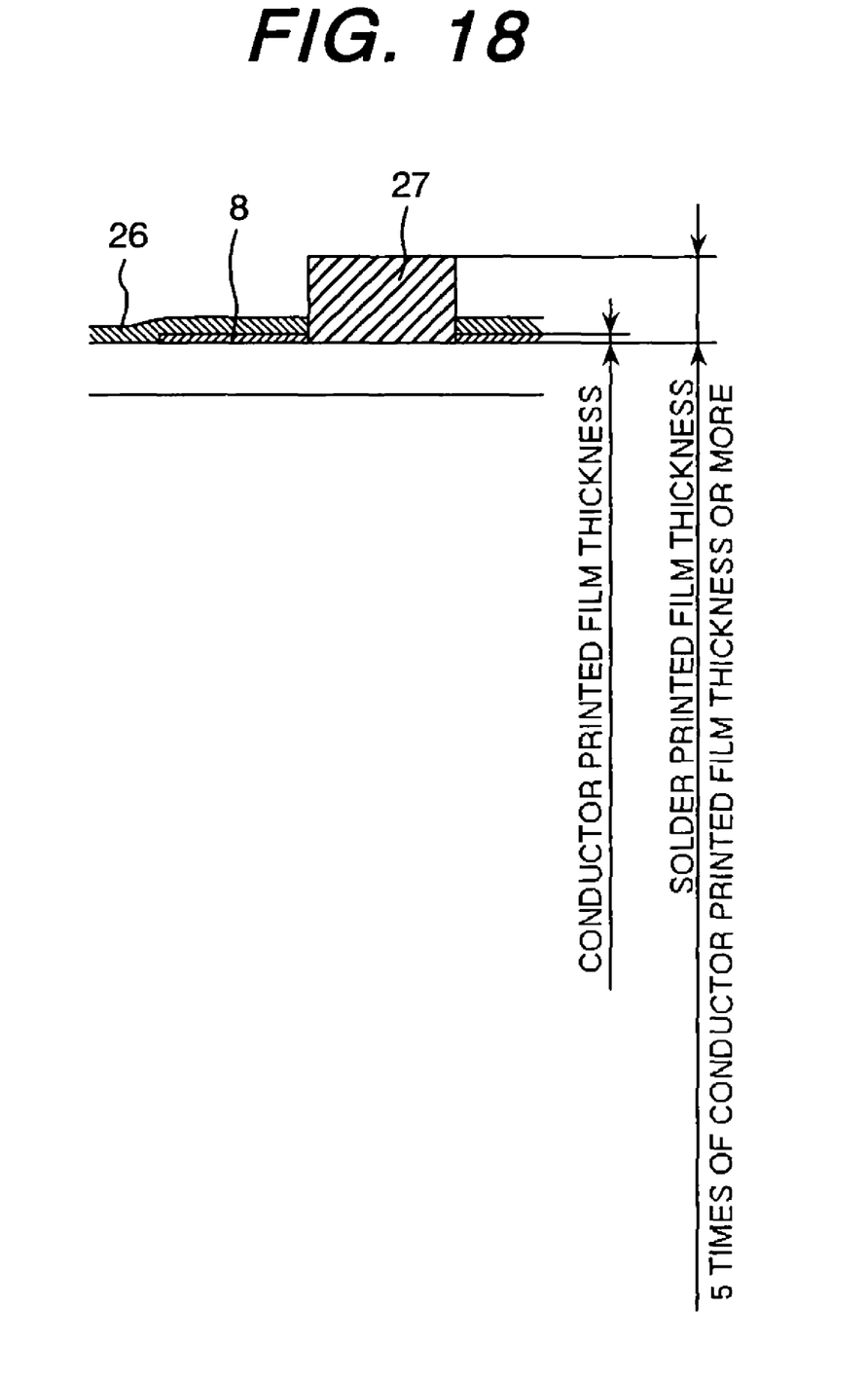
FIG. 18 is a cross sectional structure diagram of an electronic circuit substrate.

Further, conductor wires 26 (FIGS. 17, 18) on the outermost side which is formed outside the ceramic substrate 9 are often given an opportunity of application of stress at the manufacture stage and in the actual use state and apt to be damaged compared with the conductor wires formed internally, so that the conductor width on the outermost side is made wider than the inside conductor width, thus the corrosion resistance can be improved. When the conductor width on the outermost side is made two times or more of the inside conductor width, the corrosion resistance can be improved more.

The meaning of the signs used in the Figs. are as follows: 1: Electronic driving circuit, 2: Base, 3: Case, 4, 6: Adhering and fixing, 5: Cover, 7: Plane substrate, 8: Conductor wires, 9: Hybrid IC substrate, 10: Sensing element, 11: Terminal, 12: Silicone adhesive, 13: Corrosive gas of NOx or HC such as combustion gas, unburned gas, and hydrocarbon, 14: Sulfur combined gas, 15: Heating resistor, 16: Temperature sensing resistor, 17: Thermal type air flow measuring instrument, 18: Constant temperature control circuit, 19: Sub-path, 20: Intake air temperature sensor, 21: Probing portion, 22: Exposed part of conductor wires, 23: Resistor, 24, 26: Conductor wires, 25: Insulator such as glass, 27: Solder, 28: coating, such as glass or resin.

According to the present invention, the conductor wires can be prevented from corrosion in a corrosive environment to which the hybrid IC substrate is exposed.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An electronic device contained in a case member which is disposed in an air cleaner or an air duct of an automobile, comprising:
   a substrate having electronic elements mounted thereon, and conductor wire films made of silver or silver alloys, the conductor wire films being connected to the elements;
   an insulating overcoat film made of a material selected from the group consisting of glass and resin covering the surface of the device, including the conductor wire films; wherein,
   the overcoat has openings through which surfaces of the conductor wire films are exposed;
   the openings are formed in a shape having no square corners and no acute angle corners;
   the entire exposed surfaces of the conductor wire films are covered with a solder whose main component is tin, whereby the exposed surfaces of the conductor wire films are protected from any corrosive gas that may enter the case member; and
   said electronic elements and said insulating overcoat comprise thick film elements formed on said substrate.

2. An electronic device disposed in a case member placed in an air duct, comprising:
- a substrate having conductor wire films made of silver or silver alloys and electronic elements mounted thereon, said electronic elements including at least one element selected from the group consisting of resistors, capacitors, inductors, and diodes, the conductor wire films being connected to the at least one element; and
- an insulating overcoat film made of a material selected from the group consisting of glass and resin covering the surface of the device, including the conductor wire films; wherein
- the overcoat has openings through which surfaces of the conductor wire films are exposed;
- the openings are formed in a shape having no square corners and no acute angle corners;
- the entire exposed surfaces of the conductor wire films are covered with a solder whose main component is tin, whereby the exposed surface of the conductor wire films are protected from any corrosive gas that may enter the case member; and
- said electronic elements and said insulating overcoat comprise thick film elements formed on said substrate.

3. The electronic device according to claim 1, wherein the openings have a shape that is selected from the group consisting of a round, elliptical, rectangular with round corners, and rectangular with chamfered corners.

4. The electronic device according to claim 1, wherein the openings are covered with a conductive metal paste.

5. The electronic device according to claim 1, wherein the substrate has at least two layers.

6. An electronic device for a case member disposed in an air duct of an automobile, comprising:
- a substrate having conductor wire films made of silver or a silver alloy mounted thereon; and
- an insulating overcoat film made of an insulating material covering the conductor wire films; wherein
- the overcoat has an opening having no acute angle corner wherein a surface of the conductor wire films is exposed through an opening formed in the overcoat; and
- the surface of the exposed conductor wire film is covered with a solder whose main component is tin.

7. An electronic device for a case member disposed in an air duct of an automobile, comprising:
- a substrate having a resistor film mounted thereon, the resistor having conductor wire films and terminals connected thereto; and
- an overcoat film made of an insulator covering the resistor, the conductor wire films, and the terminals; wherein,
- the overcoat film has an opening formed in a shape having no acute angle corners wherein a surface of the conductor wire films is exposed; and
- the exposed surface of the conductor wire films is covered with a solder whose main component is tin.

* * * * *